(12) United States Patent
Lyu et al.

(10) Patent No.: US 8,642,374 B2
(45) Date of Patent: Feb. 4, 2014

(54) IMAGE SENSOR WITH REDUCED NOISE BY BLOCKING NITRIDATION USING PHOTORESIST

(75) Inventors: Jeong-Ho Lyu, San Jose, CA (US); Sohei Manabe, San Jose, CA (US); Howard Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 184 days.

(21) Appl. No.: 13/227,400

(22) Filed: Sep. 7, 2011

(65) Prior Publication Data

US 2013/0056800 A1 Mar. 7, 2013

(51) Int. Cl.
*H01L 27/146* (2006.01)

(52) U.S. Cl.
USPC ............... 438/75; 438/90; 438/216; 438/775; 438/954; 438/981; 257/E21.625; 257/E27.133

(58) Field of Classification Search
USPC ..................... 438/75, 90, 216, 775, 954, 981; 257/E21.625, E27.133
See application file for complete search history.

(56) References Cited

U.S. PATENT DOCUMENTS

| 6,426,305 B1 | 7/2002 | Chou et al. | |
|---|---|---|---|
| 2003/0040199 A1* | 2/2003 | Agarwal | 438/795 |
| 2005/0136595 A1* | 6/2005 | Horie | 438/775 |
| 2006/0125029 A1 | 6/2006 | Kanda | |
| 2006/0250511 A1* | 11/2006 | Lyu et al. | 438/216 |
| 2007/0054434 A1 | 3/2007 | Park et al. | |
| 2011/0254115 A1 | 10/2011 | Shih et al. | |

OTHER PUBLICATIONS

Mao et al., U.S. Appl. No. 13/227,258, filed Sep. 7, 2011.
U.S. Appl. No. 13/227,258—Non-Final Office Action, mailed Feb. 11, 2013, 11 pages.
Assaf Lahav, et al., "Optimization of Random Telegraph Noise Non Uniformity in a CMOS Pixel with a Pinned-Photodiode", Tower Semiconductor LTD., P.O. Box 619 Migdal Haemek, Israel, e-mail:asafla@towersemi.com, TEL: (972)-4-6505063, Fax:(972)-4-6547788, Biomorphic VLSI Inc., 4 pgs.
Xinyang Wang, et al., "A CMOS Image Sendsor with a Buried-Channel Source Follower", ISS002008/ Session 2/ Image Sensors & Technology/ 2.10, 2008 IEEE International Solid-State Circuits Conference 978-1-4244-2011-7/08/$25.00 © 2008 IEEE, 3 pages.
Scott T. Martin and G.P. Li, "Modeling the Bias and Scaling Dependence of Drain Current Fluctuations Due to Single Carrier Trapping in Submicron MOSFET's ", Advanced Semiconductor Device Research Laboratory, Department of Electrical and Computer Engineering, University of California, Irvine, California 92717, p. 116 and 117.

(Continued)

*Primary Examiner* — Zandra Smith
*Assistant Examiner* — Toniae Thomas
(74) *Attorney, Agent, or Firm* — Blakely Sokoloff Taylor & Zafman LLP (57) ABSTRACT

An image sensor is described in which the imaging pixels have reduced noise by blocking nitridation in selected areas. In one example, a method includes forming a first and second gate oxide layer over a substrate, forming a layer of photoresist over the first gate oxide layer, applying nitridation to the photoresist and the second gate oxide layer such that the first gate oxide layer is protected from the nitridation by the photoresist, and forming a polysilicon gate over the first and second gate oxide layers.

5 Claims, 8 Drawing Sheets

(56) References Cited

OTHER PUBLICATIONS

James Janesick, "Charge coupled CMOS and Hybrid Detector Arrays", Sarnoff Corporation, 4952 Warner Ave., Suite 300, Huntington Beach, CA 92649, Headquarters: CN5300, 201 Washington Road Princeton, NJ 08543-5300, SPIE, San Diego, Focal Plane Arrays for Space Telescope, paper #5167-1, Aug 2003, 18pgs.
Martin-Gonthier, Philippe, Magnan, Pierre. Low Frequency Noise Impact on CMOS Image Sensors. In 24th Conference on Design of Cicuits—DCIS 09, 2009, 10 pages.
Xiangli Li, Mosfet Modulated Dual Conversion Gain CMOS Image Sensors, A Dissertation Submitted in Partial Fulfillment of the Requirements for the Degree of Doctor of Philosophy in Electrical and Computer Engineering, Boise State University, Nov. 2008, 173 pages.
P. Martin-Gonthier, P. Magnan, "RTS Noise Impact in CMOS Image Sensors Readout Circuit", Universite de Toulouse, ISAE, 10 avenue E. Belin, 31055, Toulouse, France, Philippe.martin-gonthier@isae.fr, 978-1-4244-5091-6/09/$25.00 © 2009 IEEE, pp. 928-931.

* cited by examiner

IMAGE SENSOR WITH REDUCED NOISE BY BLOCKING NITRIDATION USING PHOTORESIST

TECHNICAL FIELD

The present disclosure relates generally to integrated circuits, and more particularly, to the protection of transistor gate oxide areas during nitridation.

BACKGROUND INFORMATION

In an integrated circuit, designers seek to increase the circuit density. In other words, designers seek to place more electronic devices in the same amount of space. The active devices are located in what is referred to active areas. The other areas are filled with insulators, spacers, or gaps that simply cannot be used due to the limitations of a particular layout design or the fabrication equipment.

In optical sensors, designers seek to increase the amount of space used for photodiodes (or any other type of optical sensor) as compared to other devices. This allows for larger photosites or for more photosites in the same amount of space, increasing the quality of the sensor output, or decreasing the total size of the sensor with the same quality, or both. For an optical sensor, increasing the amount of active area for the same amount of total area can allow for higher quality circuitry or for the space used for electronic devices other than photosites to be reduced.

For photodiodes and sensor arrays, as processes scale down and devices become smaller, the amount of charge accumulated by the photodiodes becomes smaller. As the level of signal is reduced, the signal-to-noise ratio becomes smaller. In order to maintain the same signal quality, the noise levels must also be reduced. One source of noise in sensor arrays is RTS (Random Telegraph Signal) noise, although there are other noise sources as well. RTS noise is caused, at least in part, by defects at interfaces between Si and $SiO_2$ layers in the system. It is believed that charge carriers are trapped and detrapped at these interface defects. The measured charge at the other side of the defect will be increased or decreased randomly as charge flows across the defect. The noise can cause undesirable flickering pixels and increase the noise of the resulting images. While such noise can cause problems in a variety of devices, it has a noticeable effect with an in-pixel source-follower transistor. At low light levels, RTS from the source-follower is a significant noise source limiting imaging quality.

RTS noise at a source-follower, such as in in-pixel source-follower, arises at least in part from trapping and de-trapping of charge carriers under the gate oxide of the in-pixel source follower and of read out devices. For advanced semiconductor processing, gate oxide nitridation is done to impede the penetration of boron dopant atoms in polysilicon gate electrodes through underlying gate oxides. Boron penetrates into the poly gate electrode as part of the poly deposition process to form the gate electrode or as part of implantation processes after the poly gate is deposited but before it is patterned. Exposing the gate oxide to nitrogen reduces boron penetration through an oxide layer such as at a transistor gate. The nitrogen containing bond structure in the oxide may also improve the reliability of a gate oxide. However, the nitridized oxide layer also contains oxide-nitrogen-oxide bonds at and near the Si/oxide interface. The added nitrogen may also significantly increase the number of interface states and traps. This may result in higher RTS noise in an image sensor source-follower transistor as well as in other locations.

Gate oxides are typically nitridized in a processing furnace. A variety of noise reduction techniques are used to reduce the impact of nitridation on the resulting pixels. The most common solution to suppress the interface traps is to control the extent of the nitridation by controlling the temperature and gas mixture. Decoupled plasma nitridation (DPN) is also used which can place more of the nitrogen close to the poly/oxide interface at the top of the gate rather than at the oxide/Si interface at the bottom of the gate. However, there is still a nitrogen distribution tail that extends through even a thick gate oxide to the Si/oxide interface. DPN also has higher costs because it requires advanced processing tools.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Typically, a semiconductor has a gate oxide under the gate electrode of any CMOS transistors. The thickness of the gate oxide is adjusted based on the electrical characteristics that are desired for each transistor. In a pixel circuit, a source-follower transistor, which serves as an amplifier, will have a much thicker gate oxide than many of the other transistors that serve as switches. However, when nitridation is used it is typically applied over the whole silicon wafer surface. As a result, both thin and thick gate oxides are subject to nitridation. However, nitridation may not be needed for all of the gate oxide layers. If, for example, nitridation is used to block the penetration of boron or other dopants through the gate oxide, then it is only needed for thin gate oxide layers. Thick gate oxide layers, commonly used for pixel array amplifiers and for analog circuit elements are much less susceptible to boron penetration.

Any of the transistor gate oxide layers in the system including the source-follower gate oxide layers can be protected from nitridation while the standard gate oxides are exposed to nitridation. A photoresist layer for example can be patterned over the surface of the substrate before the substrate is nitridized. After nitridation, it may be removed before the nitrided pattern is annealed. Since plasma nitridation is a low temperature process, less than 100° C. or 200° C., photoresist can easily withstand the process. The photoresist can be used to suppress the incorporation of nitrogen into the protected gate oxides. This will suppress the formation of traps at the interface between the bottom of the thick gate oxide and the silicon below.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals. The present invention is presented in the context of a CMOS (Complementary Metal Oxide Semiconductor) imaging integrated circuit, in the form of a camera chip, suitable for use with a camera for machine vision, recording, and communications, however the invention is not so limited.

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon a substrate.

Figure 1:
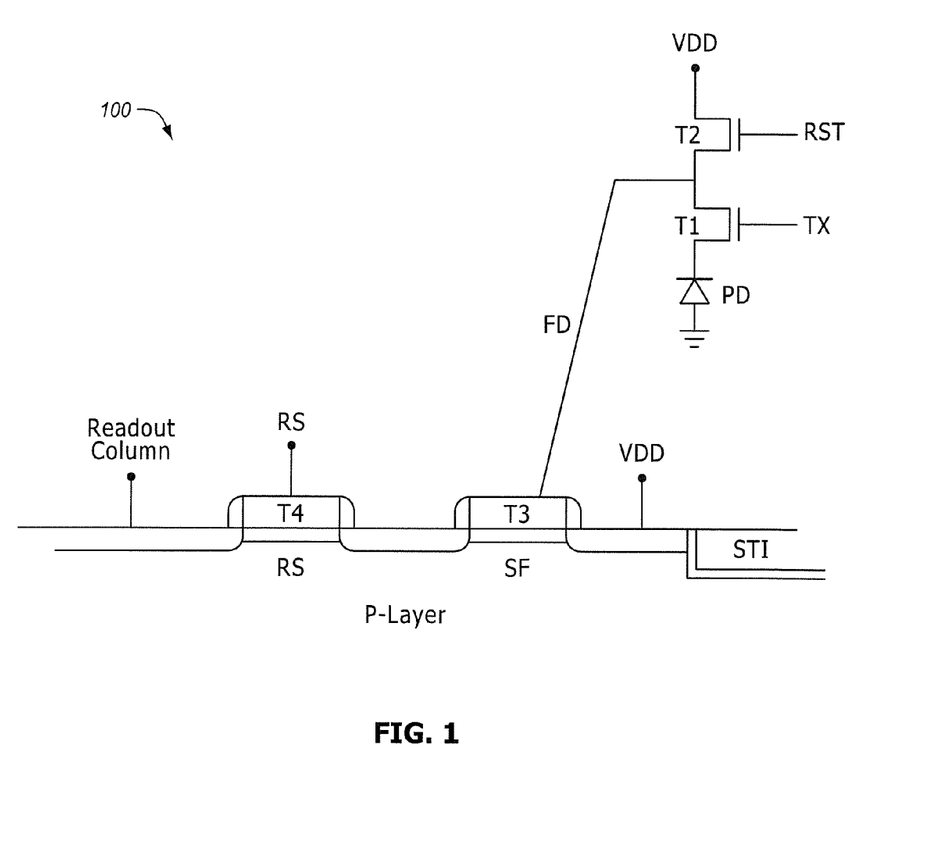
FIG. 1 is a hybrid cross-sectional diagram view and circuit diagram of a four transistor imaging pixel, according to an embodiment of the invention.

FIG. 1 shows a hybrid cross-sectional and circuit diagram of an example of an active pixel cell 100 that uses four transistors, a 4T pixel cell. The 4T pixel cell 100 includes a photodiode PD, a transfer transistor T1, a reset transistor T2, a source-follower ("SF") or amplifier ("AMP") transistor T3, and a row select ("RS") transistor T4.

During operation, the transfer transistor T1 receives a transfer signal TX, which transfers the charge accumulated in the photodiode PD to a floating drain/diffusion node FD. Reset transistor T2 is coupled between a power rail VDD and the FD node to reset the pixel (e.g., discharge or charge the FD and the PD to a preset voltage) under control of a reset signal RST. The node FD is coupled to control the gate of the SF or AMP transistor T3. The AMP transistor T3 is coupled between the power rail VDD and RS transistor T4. The AMP transistor T3 operates as a source-follower (SF) providing a high impedance connection to the floating diffusion node. Finally, the RS transistor T4 selectively couples the output of the pixel circuitry to the readout column line under control of a signal RS. As shown, the gate oxide under the SF is much thicker than under the other transistors. This occurs because the SF is used as n amplifier with a high impedance. The other transistors are used as switches.

In normal operation, the PD and FD node are reset to the supply voltage VDD by temporarily asserting the reset signal RST and the transfer signal TX. The image accumulation window (exposure period) is commenced by de-asserting the transfer signal TX and permitting incident light to charge the photodiode PD. As photogenerated electrons accumulate on the photodiode PD, its voltage decreases (electrons are negative charge carriers). The voltage or charge on the PD is indicative of the intensity of the light incident on the PD during the exposure period. At the end of the exposure period, the reset signal RST is de-asserted to isolate the FD node and the transfer signal TX is asserted to couple the photodiode to the FD node and thereby the gate of the SF transistor T3. The charge transfer causes the voltage of the FD node to drop from VDD to a second voltage indicative of the amount of charge (e.g., photogenerated electrons accumulated on the PD during the exposure period). This second voltage biases the SF transistor T3, which is coupled to the readout column line when the row select signal is asserted on the RS transistor T4.

FIGS. 2A through 2E illustrate a process for fabricating two transistors within a CMOS image sensor. The diagrams for this process are highly simplified and many additional structures and processes may be involved in the formation of any actual circuit. The two transistors will be formed with two different thicknesses of gate oxide. The transistor on the left will have a thick gate oxide and the transistor on the right will have a thin gate oxide. This particular configuration is particularly useful for a source-follower transistor located near other transistor circuitry, however, the invention is not so limited.

Figure 2A:
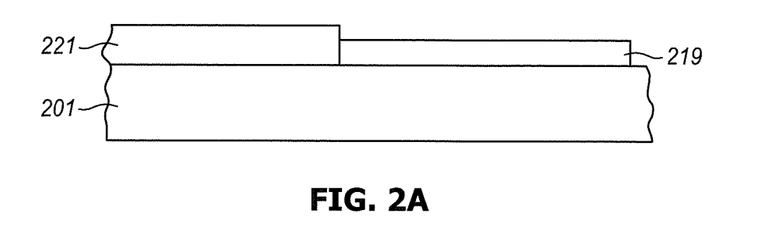
FIGS. 2A-2J are cross-sectional diagram views of nearby transistors at various stages of fabrication, according to first and second embodiments of the invention.

FIG. 2A shows a silicon substrate 201 overlaid by a thick oxide layer 221 in one area that will eventually form a gate oxide for a transistor. A thin gate oxide layer 219 is formed in a second area for a gate oxide of a second transistor. A doped layer or implant well may be formed in the silicon substrate. The doped layer is normally formed having a conductivity type (such as an N-type). The gate oxide layers are 203 is formed on regions of doped n-wells of the substrate.

Photosensitive areas (not shown) may be formed elsewhere in the doped layer near the illustrated area. The source and drain are usually formed after the gate oxide. The sources and drains (not shown) of the transistors are disposed on either side of the transistors or along an axis that is at right angles to the face of the cross-section shown in FIGS. 1 and 2. The term "channel" as used herein includes the meaning of being the area (typically between the source and drain and under the gate) in which transconductance occurs, even when no such transconductance is present (such as when the circuit is not powered up). The gate oxide layers 219, 221 can be formed by growing a film of silicon dioxide on the surface of the doped layer 201 or implant wells. Photoresist patterning or other techniques may be used to pattern thick and thin oxide layers in the desired locations.

Figure 2B:
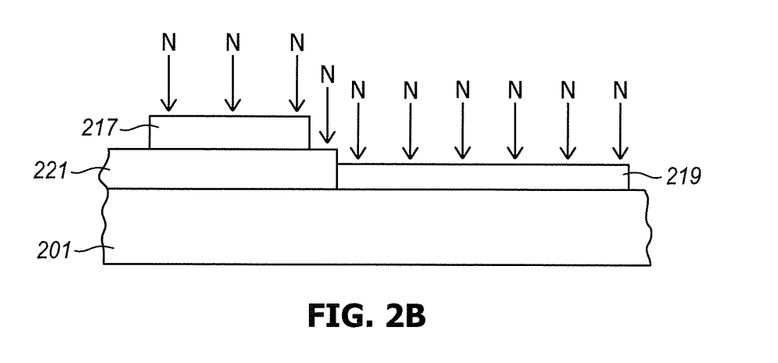

FIG. 2B shows the deposition of a protective photoresist pattern 217 over the thick gate oxide 221 but not the thin gate oxide 219 and then nitridation over the whole surface of the formation. The formation is nitridized using, for example, furnace nitridation or decoupled plasma nitridation (DPN). The nitridation may be performed at a temperature low enough not to damage the photoresist, for example, lower than 100° C. or 200° C.

The plasma nitridation is blocked by the photoresist so that the portion of the thick gate oxide that is covered is not nitrided while every structure that is not protected by photoresist is nitrided. During the process, there may be some nitridation of the photoresist, however, the photoresist is removed in the next process. The photoresist, in effect, prevents nitrogen from reaching the covered thick gate oxide. The deleterious RTS noise caused by the nitrided gate oxide is therefore also avoided.

Figure 2C:
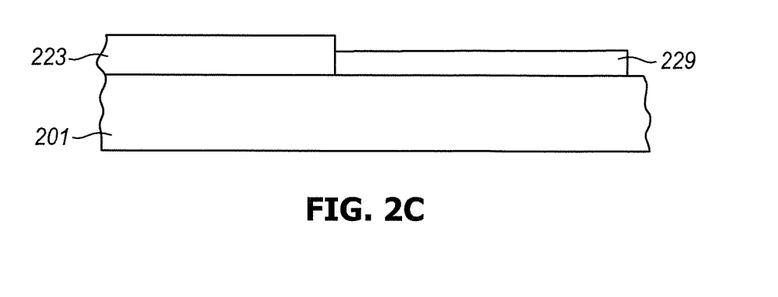

In FIG. 2C, the photoresist is removed, leaving the two gate oxide layers. The thick gate oxide layer 223 is now partially nitrided at its edges which were not covered by the photoresist. The thin gate oxide layer 229 is nitrided across its entire top surface. This suppresses the amount of nitrogen that can penetrate into the thick gate oxide and through the thick gate oxide to the oxide/Si interface 211. As mentioned above, nitrogen near this interface can result in electron flow experiencing interface states and traps that can add or subtract from the transmitted charge. This can manifest as random telegraph noise at an output. The photoresist acts as a barrier layer. Consequently, less nitrogen is incorporated at the oxide/Si interface, resulting in less electron traps under the thick oxide and lower RTS noise in a final image sensor containing SF transistors formed using the described process.

Figure 2D:
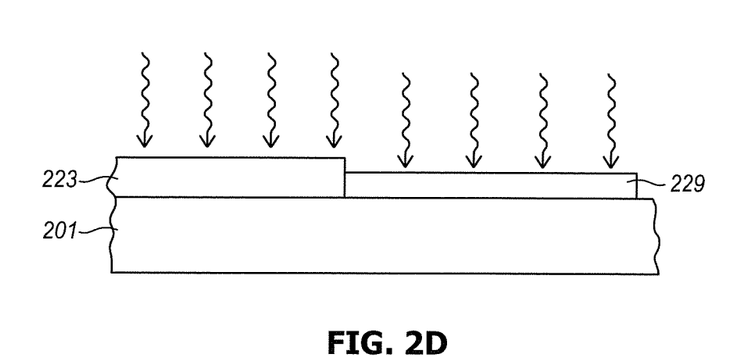

In FIG. 2D the gate oxides are annealed. This is may be an optional second step in the plasma nitridation process. The annealing may be at a temperature above 1000° C. which is higher than desired for photoresist, so the photoresist has been removed before the annealing. The particular temperature and durations for the plasma nitridation and for the annealing can be adapted to suit a particular process and the desired physical parameters of the resulting device.

Figure 2E:
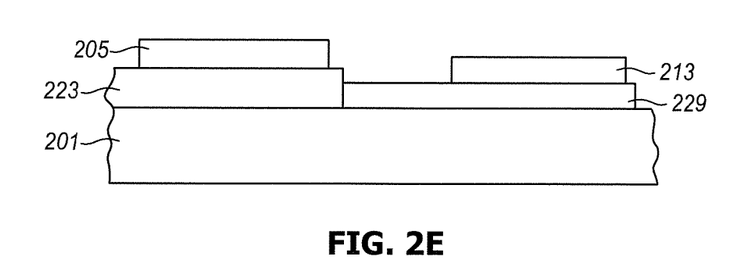

In FIG. 2E, polysilicon or polycrystalline silicon gate electrode layers 205, 213 are formed over the thick 223 and thin 229 gate oxides, respectively. The gates can be formed by depositing a layer of polycrystalline silicon, polysilicon/silicide, and/or any other suitable conductor or metal. Suitable metals include Ni, W, Ti, Co and silicides of these and other metals. The gate electrodes can be patterned using resist and etching methods. A layer of photoresist (not shown) can be patterned over the structure. The gate electrode material is etched and the photoresist removed to form the gate electrodes for the thick and thin oxide transistors.

As shown, the gate oxides 223, 229 separate the gate electrodes 205, 213 from the implant areas of the substrate. The doped polysilicon layers 205, 213 can be deposited on the surface of the gate oxide layer to form the transistor gate electrode. The gate electrode may extend over the tops of gate oxide region and isolation regions, depending on the particular design of the system.

A variety of different processes may be applied to complete the transistors and any other structures on the substrate. The gate oxide has now been divided into two parts 223, 229. The thin oxide parts 219 have been fully exposed to the nitridation, while the thick oxide parts have little or no nitridation. In a subsequent boron or polysilicon gate doping operation, the nitride content of the thin oxide will protect the underlying substrate. The thick oxide 221 has little or no nitride content, however, it will protect the underlying substrate by virtue of its thickness.

Additional structures and layers are not shown in order not to obscure details of the present invention. Sidewall spacers, wells, source, drains, and a variety of different types of connections, for example, are not shown.

Additional layers, such as insulating layers (not shown) can be formed over the transistor gates and regions of the insulating STI structure and protective implant. Metal contacts can also be formed within or over the insulating layers by etching a cavity and filling the cavity with a metal. Metallization layers or other types of conductive traces can be formed over the metal contact and portions of insulating layer such that electrical connections can be made between the transistors and other components. These operations are not shown and can be performed in any of a variety of different ways.

Figure 2F:
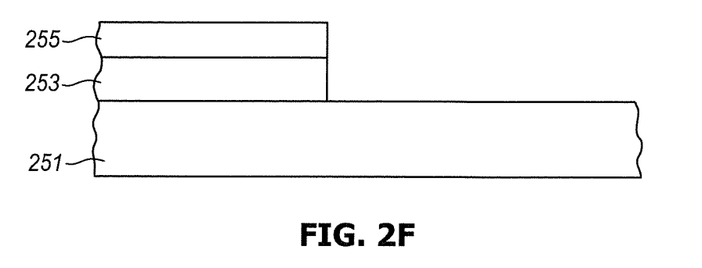

FIG. 2F to 2J show an alternative process for fabricating transistors on a single substrate in which some have nitrided gate oxides and others do not. In FIG. 2F, a substrate 251, similar to that of FIG. 2A has a pattern of thick oxide 253. A poly gate 255 is formed over the gate oxide.

Figure 2G:
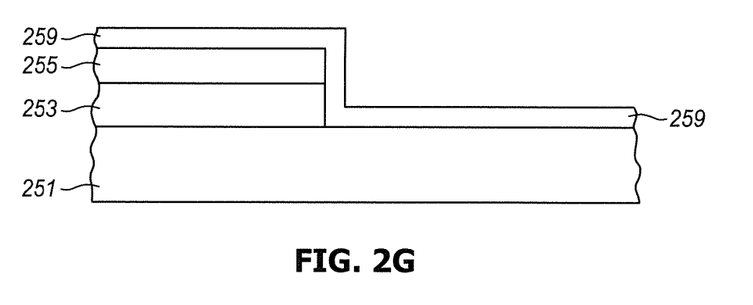
Figure 2H:
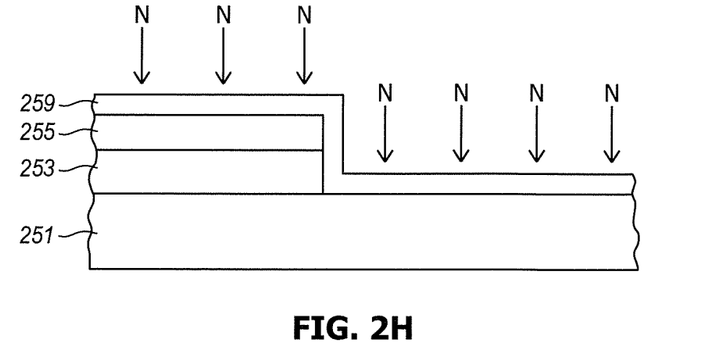
Figure 2I:
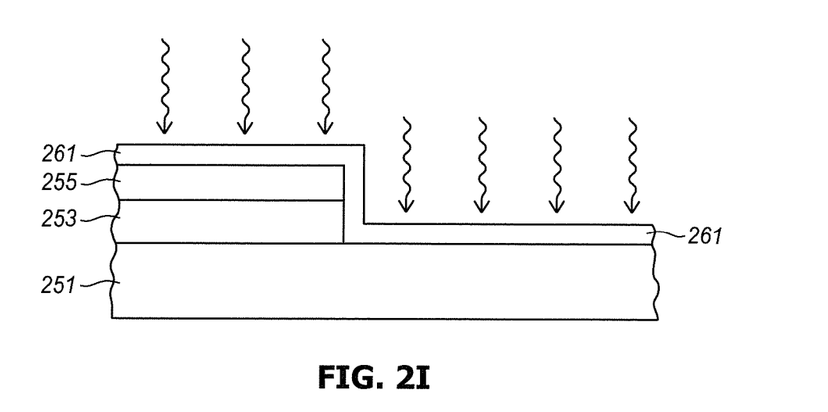
Figure 2J:
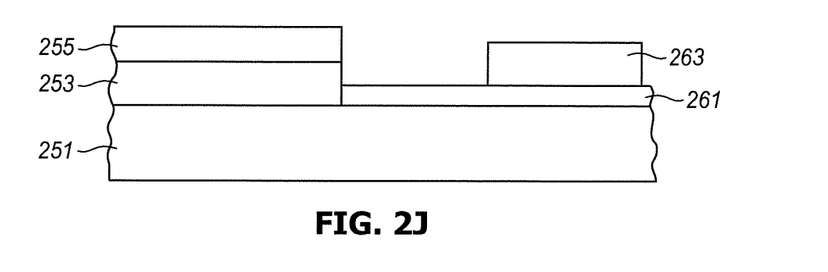

In FIG. 2G, a thin layer of gate oxide 259 is grown over the entire structure. In FIG. 2H, the entire structure is nitrided using processes such as those mentioned above in the context of FIG. 2B. The nitrided thin gate oxide 261, is then able to act as a block for dopant penetration in later steps and to offer other benefits of nitridation. In FIG. 2I, the structure is annealed. Finally, FIG. 2J is a diagram of the structure with a poly gate electrode 263 formed over the nitrided thin gate oxide 261. FIG. 2J also shows that the thin gate oxide layer 261 has been removed from over the gate electrode layer 255 and gate electrode 255 has been formed on thick gate oxide layer 253. As with FIG. 2E, additional operations can be performed to complete the device.

The descriptions above are provided only as examples. A variety of modifications and variations may be performed within the scope of the present invention. For example in one embodiment of the invention, the thin oxide is grown first. Then the thin oxide transistors are masked with resist, and the gate oxide is etched away in the thick oxide transistor regions. In the above examples, the thick oxide is not nitride, while the thin oxide is nitrided. The particular selection of which transistors will have nitride gate oxides can be adapted to suit different applications. In some cases, some or all of the thick gate oxides may be nitride and some or all of the thin gate oxides may be protected from nitridation, depending on the particular application.

Embodiments of the invention are equally applicable to image sensors having P type PD regions formed in an N-epitaxial layer. Although FIGS. 1 through 2J show a single pixel or image sensor or a portion thereof, the structure of the image sensor may be replicated in a grid-like pattern to form a CMOS imaging array where each pixel is separated from adjacent pixels by shallow trench isolations ("STI") and boron implanted protection layers.

Figure 3:
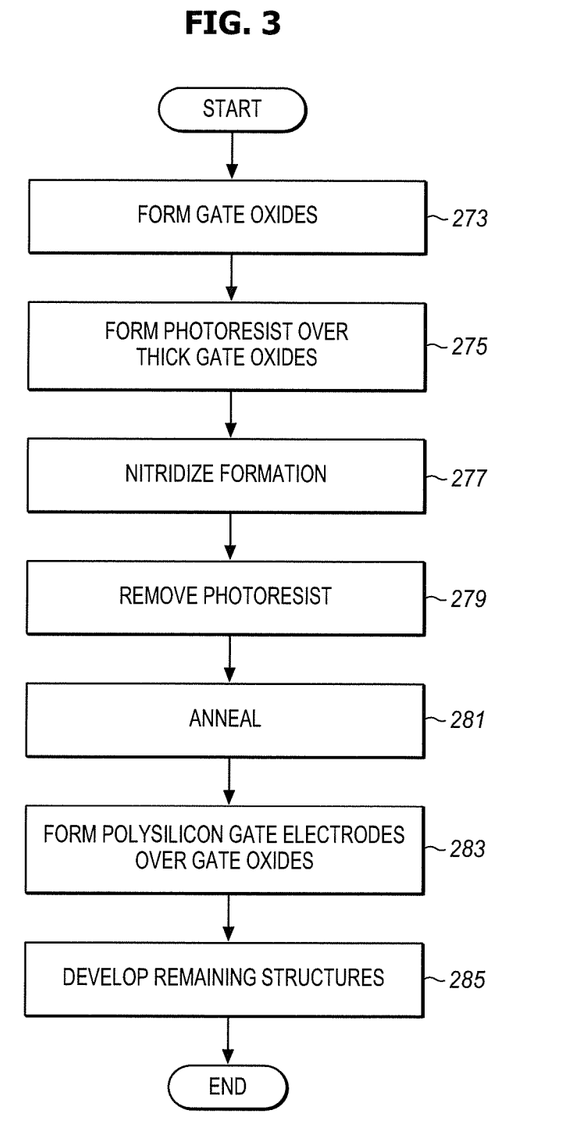
FIG. 3 is a flow chart illustrating a process for fabricating transistors, according to an embodiment of the invention.

FIG. 3 is a flow chart illustrating a process for using a photoresist layer as a protective layer during nitridation. In FIG. 3 at 273, thick and thin gate oxide layers are formed over a substrate. The substrate may have any number of additional structures already formed including wells, nodes, and protection and barrier layers. At 275, a protective photoresist layer is formed over the thick gate oxide. As mentioned above, a variety of other materials may be used instead of the photoresist that are also easily removed and effective as a nitrogen barrier.

At 277, the thin and thick gate areas are nitridized, so that the thin gate oxide and the photoresist is exposed to the nitrogen. However, at least some of the thick gate oxide is protected from the nitrogen by the photoresist. At 279, the photoresist is removed and at 281, with the photoresist removed the structure is annealed to finish the nitridation.

At 283, polysilicon gates are formed over the thick and the thin gate oxides respectively to finish the gate electrodes of the transistor structures that are being formed. Source and drains for the transistors may also be formed before or after this operation.

At 285, other structures are developed to produce the final intended structure. In the illustrated examples, the final structure is a pixel sensor imaging array with associated circuitry. However the invention is not so limited. While the operations are shown as being in direct sequence, there may be many other operations after nitridation and before the transistors are completed including before annealing. Similarly, additional operations may be performed between any two of the operations represented in the flow chart as well as before and after any of the operations.

Figure 4:
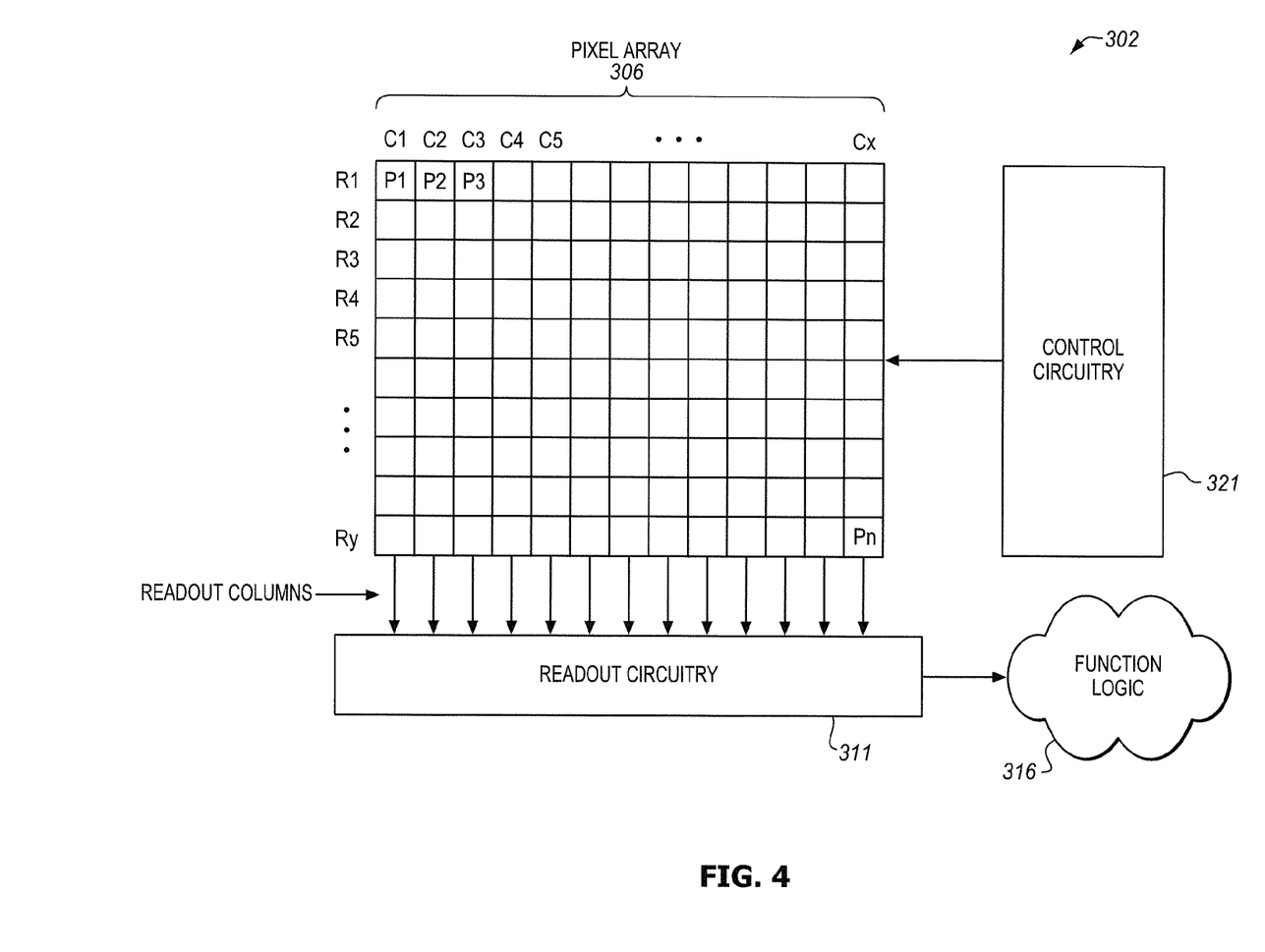
FIG. 4 is a block diagram illustrating a pixel array imaging system, according to an embodiment of the invention.

FIG. 4 is a block diagram illustrating an imaging system 302, in accordance with an embodiment of the invention. The illustrated embodiment of imaging system 302 includes an image sensor array 306, readout circuitry 311, function logic 316, and control circuitry 321.

The image sensor array 306 is a two-dimensional ("2D") array of image sensors or pixels (e.g., pixels P1, P2 . . . , Pn). In one embodiment, each pixel P1-Pn may be implemented with a high full-well-capacity image sensor, such as the image sensor 100 illustrated in FIG. 1. In one embodiment, each pixel is a complementary metal-oxide-semiconductor ("CMOS") imaging pixel. Image sensor array 306 may be implemented as either a front side illuminated image sensor array or a backside illuminated image sensor array. In one embodiment, the image sensor array 306 includes a color filter pattern, such as a Bayer pattern or mosaic of red, green, and blue additive filters (e.g., RGB, RGBG or GRGB), a color filter pattern of cyan, magenta, yellow, and key (black) subtractive filters (e.g., CMYK), a combination of both, or otherwise. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by the readout circuitry 311 and transferred to the function logic 316. The readout circuitry 311 may include amplification circuitry, analog-to-digital ("ADC") conversion circuitry, or otherwise. The function logic 316 may simply store the image data or even manipulate the image data by applying post image effects (e.g., crop, rotate, remove red eye, adjust brightness, adjust contrast, or otherwise). In one embodiment, the readout circuitry 311 may readout a row of image data at a time along readout column lines (illustrated) or may readout the image data using a variety of other techniques (not illustrated), such as a column readout, a serial readout, or a full parallel readout of all pixels simultaneously.

The control circuitry 321 is coupled to the image sensor array 306 to control operational characteristic of the image sensor array 306. For example, the control circuitry 321 may generate a shutter signal for controlling image acquisition. In one embodiment, the shutter signal is a global shutter signal for simultaneously enabling all pixels within the image sensor array 306 to simultaneously capture their respective image data during a single acquisition window (exposure period). In an alternative embodiment, the shutter signal is a rolling shutter signal whereby each row, column, or group of pixels is sequentially enabled during consecutive acquisition windows.

Figure 5:
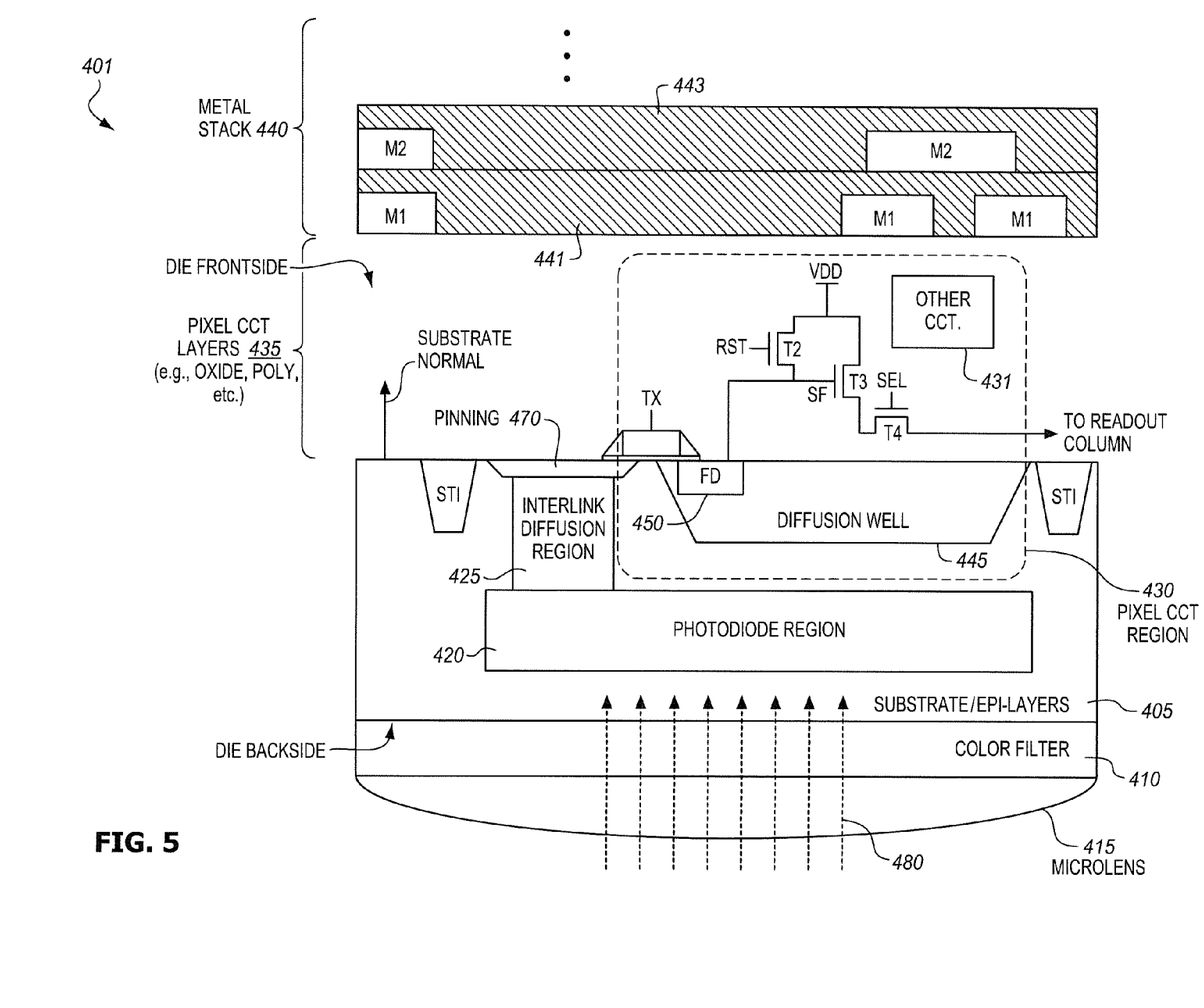
FIG. 5 is a hybrid cross sectional and circuit diagram of a backside illuminated imaging pixel with overlapping pixel circuitry, according to an embodiment of the invention.

FIG. 5 is a hybrid cross sectional/circuit illustration of a backside illuminated imaging pixel 401 with overlapping pixel circuitry, in accordance with an embodiment of the invention. The imaging pixel 401 is one possible implementation of pixels P1 to Pn within the pixel array 302 of FIG. 4. The illustrated embodiment of the imaging pixel 401 includes a substrate 405, a color filter 410, a microlens 415, a PD region 420, an interlinking diffusion region 425, a pixel circuitry region 430, pixel circuitry layers 435, and a metal stack 440. The illustrated embodiment of the pixel circuitry region 430 includes a 4T pixel (other pixel designs may be substituted), as well as other circuitry 431 (e.g., gain circuitry, ADC (Analog to Digital Converter) circuitry, gamma control circuitry, exposure control circuitry, etc.), disposed over a diffusion well 445.

A floating diffusion 450 is disposed within diffusion well 445 and coupled between the transfer transistor T1 and the gate of the SF transistor T3. The illustrated embodiment of the metal stack 440 includes two metal layers M1 and M2 separated by intermetal dielectric layers 441 and 443. Although FIG. 5 illustrates only a two layer metal stack, the metal stack 440 may include more or less layers for routing signals over the frontside of the pixel array 301. In one embodiment, a passivation or pinning layer 470 is disposed over the interlinking diffusion region 425. Finally, shallow trench isolations ("STI") isolate the imaging pixel 401 from adjacent pixels (not illustrated).

As illustrated, the imaging pixel 401 is photosensitive to light 480 incident on the backside of its semiconductor die. By using a backside illuminated sensor, pixel circuitry region 430 can be positioned in an overlapping configuration with the photodiode region 420. In other words, the pixel circuitry can be placed adjacent to the interlinking diffusion region 425 and between the photodiode region 420 and the die frontside without obstructing light 480 from reaching the photodiode region 420. By placing the pixel circuitry in an overlapping configuration with the photodiode region 420, as opposed to a side-by-side configuration, the photodiode region 420 no longer competes for valuable die real estate with the pixel circuitry. Rather, the pixel circuitry region 430 can be enlarged to accommodate additional or larger components without detracting from the fill factor of the image sensor.

Embodiments of the present invention enable other circuits 431, such as gain control or ADC circuitry (e.g., ADC 305), to be placed in close proximity to their respective photodiode region 420 without decreasing the sensitivity of the pixel. By inserting gain control and ADC circuitry in close proximity to each PD region 420, circuit noise can be reduced and noise immunity improved due to shorter electrical interconnections between PD region 420 and the additional in-pixel circuitry. Furthermore, the backside illumination configuration provides greater flexibility to route signals over the frontside of pixel array 205 within metal stack 440 without interfering with light 480. In one embodiment, the shutter signal is routed within the metal stack 440 to the pixels within the pixel array 205.

In one embodiment, the pixel circuit regions 430 over the PD regions 420 of adjacent pixels within the pixel array can be grouped to create communal die real estate. This communal die real estate can support shared circuitry (or inter-pixel circuitry) in addition to the basic 3T, 4T, 5T, etc. pixel circuitry. Alternatively, some pixels can donate their unused die real estate above their PD regions 420 to an adjacent pixel requiring additional pixel circuitry space for larger or more advanced in-pixel circuitry. Accordingly, in some embodiments, other circuitry 431 may overlap two or more PD regions 420 and may even be shared by one or more pixels.

In one embodiment, the substrate 405 is doped with P type dopants. In this case, substrate 405 and the epitaxial layers grown thereon may be referred to as a P substrate. In a P type substrate embodiment, the diffusion well 445 is a P+ well implant while photodiode region 420, interlinking diffusion region 425, and floating diffusion 450 are N type doped. The floating diffusion 450 is doped with an opposite conductivity type dopant as diffusion well 445 to generate a p-n junction within the diffusion well 445, thereby electrically isolating the floating diffusion 450. In an embodiment where substrate 405 and the epitaxial layers thereon are N type, diffusion well 445 is also N type doped, while the photodiode region 420, the interlinking diffusion region 425, and the floating diffusion 450 have an opposite P type conductivity.

The pixel circuitry region 430 shows a four-transistor ("4T") pixel within the imaging pixel 401, in accordance with an embodiment of the invention. The illustrated pixel circuitry is one possible pixel circuitry architecture for implementing each pixel within the image sensor array. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 5, the pixel circuitry includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

The reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. The SF transistor T3 is coupled between the power rail VDD and select transistor T4. SF transistor T3 operates as a source-follower providing a high impedance connection to the floating diffusion FD. Finally, the select transistor T4 selectively couples the output of pixel circuitry 800 to the readout column line under control of a select signal SEL.

In one embodiment, the TX signal, the RST signal, and the SEL signal are generated by control circuitry 321 as shown in FIG. 4. In an embodiment where the image sensor array 306 operates with a global shutter, the global shutter signal is coupled to the gate of each transfer transistor T1 in the entire image sensor array 306 to simultaneously commence charge transfer from each pixel's photodiode PD. Alternatively, rolling shutter signals may be applied to groups of transfer transistors T1.

The techniques described herein may be used in different way to reduce noise in each pixel and in the entire image sensor. In one embodiment, all of the transistors are nitride except for the source-follower transistor or amplifier which is protected during nitridation by its polysilicon gate. In another embodiment, the nitridation is blocked over all the transistors in each pixel i.e. the transfer gate, reset gate, and the source-follower. This can reduce noise even more than just blocking nitridation for the source-follower. In another embodiment, the reset gate is nitrided the reset gate and the other gates are not. In these examples, the row select and column select are considered to be physically outside the pixel and are not nitrided.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating an image sensor comprising:
   forming a first gate oxide layer over a substrate;
   forming a second gate oxide layer over the substrate, wherein forming a first gate oxide layer comprises forming a thick gate oxide layer and wherein forming a second gate oxide layer comprises forming a thin gate oxide layer;
   forming a layer of photoresist over the first gate oxide layer;
   applying nitridation to the photoresist and the second gate oxide layer such that the first gate oxide layer is protected from the nitridation by the photoresist;
   removing the photoresist;
   forming a polysilicon gate over the first gate oxide layer;
   forming a polysilicon gate over the second gate oxide layer;
   forming a first transistor using the first gate oxide layer, wherein forming the first transistor includes forming an amplifier;
   forming a second transistor using the second gate oxide layer; and
   forming a reset transistor and a transmit transistor using the second gate oxide layer.

2. The method of claim 1, wherein the first gate oxide layer has a lower level of nitridation after applying nitridation than the second gate oxide layer.

3. The method of claim 1, further comprising annealing the first and second gate oxide layers before forming a polysilicon gate.

4. The method of claim 1, wherein forming a polysilicon gate over the first gate oxide layer and forming a polysilicon gate over the second gate oxide layer are performed simultaneously.

5. A method of fabricating an image sensor comprising:
   forming a first gate oxide layer over a substrate;
   forming a second gate oxide layer over the substrate, wherein the second gate oxide is thinner than the first gate oxide;
   forming a layer of photoresist over the first gate oxide layer;
   applying nitridation to the photoresist and the second gate oxide layer such that the first gate oxide layer is protected from the nitridation by the photoresist;
   removing the photoresist;
   forming a first polysilicon gate over the first gate oxide layer;
   forming a second polysilicon gate and a third polysilicon gate over the second gate oxide layer;
   forming an amplifier transistor that includes the first polysilicon gate and the first gate oxide layer;
   forming a reset transistor that includes the second polysilicon gate and the second gate oxide layer; and
   forming a transmit transistor that includes the third polysilicon gate and the second gate oxide layer.

* * * * *